US008170233B2

(12) United States Patent
Horbach

(10) Patent No.: US 8,170,233 B2
(45) **Date of Patent: *May 1, 2012**

(54) LOUDSPEAKER ARRAY SYSTEM

(75) Inventor: Ulrich Horbach, Agoura Hills, CA (US)

(73) Assignee: Harman International Industries, Incorporated, Northridge, CA (US)

( * ) Notice: Subject to any disclaimer, the term of this patent is extended or adjusted under 35 U.S.C. 154(b) by 1236 days.

This patent is subject to a terminal disclaimer.

(21) Appl. No.: 10/771,190

(22) Filed: Feb. 2, 2004

(65) Prior Publication Data

US 2005/0180577 A1 Aug. 18, 2005

(51) Int. Cl.
*H04R 1/02* (2006.01)
*H03G 5/00* (2006.01)

(52) U.S. Cl. ........................................ 381/89; 381/99

(58) Field of Classification Search .................... 381/89, 381/97, 99, 300, 306, 103
See application file for complete search history.

(56) References Cited

U.S. PATENT DOCUMENTS

| | | | | |
|---|---|---|---|---|
| 4,885,782 | A * | 12/1989 | Eberbach | 381/99 |
| 5,233,664 | A | 8/1993 | Yanagawa et al. | |
| 5,642,429 | A | 6/1997 | Janssen | |
| 5,956,411 | A * | 9/1999 | Edgar | 381/97 |
| 6,128,395 | A * | 10/2000 | De Vries | 381/387 |
| 6,771,784 | B2 * | 8/2004 | Murata | 381/99 |
| 7,319,641 | B2 * | 1/2008 | Goudie et al. | 367/138 |
| 2003/0059056 | A1 | 3/2003 | Griniasty | |
| 2005/0041530 | A1 | 2/2005 | Goudie et al. | |
| 2005/0169493 | A1 | 8/2005 | Horbach | |

FOREIGN PATENT DOCUMENTS

| | | |
|---|---|---|
| FR | 2828326 A1 | 2/2003 |
| JP | 06-038289 | 2/1994 |
| JP | 9-512159 | 12/1997 |
| JP | 2001-095082 | 4/2001 |
| WO | WO 96/14723 | 5/1996 |
| WO | WO 03/034780 A2 | 4/2003 |
| WO | WO 2004/075601 A1 | 9/2004 |

OTHER PUBLICATIONS

Joseph A. D'Appolito; A Geometric Approach to Eliminating Lobing Error in Multiway Loudspeakers; Oct. 8-12, 1983; pp. 1-16.
Mithat F. Konar; Vertically Symmetric Two-Way Loudspeaker Arrays Reconsidered; May 11-14, 1996; pp. 1-20.
Ulrich Horbach; Design of High-Quality Studio Loudspeakers Using Digital Correction Techniques; Sep. 22-25, 2000; 22 pages (unnumbered).
Larry Greenhill; Snell Acoustics XA Reference Tower Loudspeaker; Stereophile Magazine, Apr. 2002; 7 pages (unnumbered).
Menno Van Der Wal, Evert W. Start and Diemer De Vries; Design of Logarithmically Spaced Constant-Directivity Transducer Arrays; Jun. 1996; J. Audio Eng. Soc., vol. 44, No. 6; pp. 497-507.

(Continued)

*Primary Examiner* — Ping Lee
(74) *Attorney, Agent, or Firm* — The Eclipse Group LLP

(57) ABSTRACT

The invention is a multi-channel loudspeaker system that provides a compact loudspeaker configuration and filter design methodology that operates in the digital signal processing domain. Further, the loudspeaker system can be designed to include drivers of various physical dimensions and can achieve prescribed constant directivity over a large area in both the vertical and horizontal planes.

16 Claims, 8 Drawing Sheets

OTHER PUBLICATIONS

David Smith; Tech Facts: What is XA?; 7 pages (unnumbered).

Dynaudio; Confidence model C4; one page (unnumbered).

John Eargle and William Gelow; Performance of Horn Systems: Low-Frequency Cut-off, Pattern Control, and Distortion Trade-Offs; Nov. 8-11, 1996; 19 pages.

JBL Professional; Progressive Transition™ (PT) Waveguides; Technical Notes vol. 1, No. 31; pp. 1-12; Apr. 2002.

Alastair Sibbald; Sensaura Transaural Acoustic Crosstalk Cancellation; pp. 1-10; 2001.

Charles E. Hughes; A Generalized Horn Design to Optimize Directivity Control & Wavefront Curvature; Sep. 24-27, 1999; 17 pages.

1 Limited; Digital Sound Projector; True Surround Sound from a Single Loudspeaker Panel; 4 pages; (undated).

* cited by examiner

LOUDSPEAKER ARRAY SYSTEM

BACKGROUND OF THE INVENTION

1. Field of the Invention

This invention generally relates to a multi-way loudspeaker system and in particular to a multi-way loudspeaker system comprised of an array of multiple drivers capable of achieving high-quality sound.

2. Related Art

High-quality loudspeakers for the audio frequency ranges generally employ multiple specialized drivers for dedicated parts of the audio frequency band, such as tweeters (generally 2 kHz-20 kHz), midrange drivers (generally 200 Hz-5 kHz) and woofers (generally 20 Hz-1 kHz). Because of the necessary spacing due to the physical size of the specialized drivers, which is comparable with the wavelength of the radiated sound, the acoustic outputs of the drivers sum up to the intended flat, frequency-independent response only on a single line perpendicular to the loudspeaker, usually at the so-called acoustic center. Outside of that axis, frequency responses are more or less distorted due to interferences caused by different path lengths of sound waves traveling from the drivers to the considered points in space. There have been many attempts in history to build loudspeakers with a controlled sound field over a larger space with smooth out-of-axis responses.

For example, D'Appolito has presented a geometric approach to eliminate lobing errors in multi-way loudspeakers—a configuration using a center tweeter and two woofers arranged symmetrically along a vertical axis. Several loudspeaker manufacturers have adopted that approach and have even expanded upon it by using arrays of symmetrically arranged midrange drivers and woofers around one or two center tweeters. D'Appolito designs and those of the manufacturers that have adopted D'Appolito's approach utilize passive or analog crossover circuits or digital filters that emulate analog filters in a digital domain. Analog or passive crossover circuits inevitably introduce phase distortion. Further, with this design, spacing is not optimum and in general too large to completely avoid out-of-axis aberrations from an ideal smooth response.

In an alternative solution, the basic design concept is to apply very steep, "brick-wall" finite impulse response (FIR) filters to avoid large transition bands, so that the errors become inaudible. However, the individual polar responses of the involved drivers may still be different at the transition point, leaving audible discontinuities. Thus, with this design solution, it may be difficult to achieve a prescribed, smooth polar behavior throughout the whole audible range.

In yet another alternative, Van der Wal suggests that logarithmically spaced transducer arrays can achieve a very well controlled directivity, approximately constant over a wide frequency range, in one dimension. Some embodiments of this technique are described in U.S. Pat. No. 6,128,395. Like the previously described techniques, this design technique is limited because (i) the logarithmic spacing is prescribed only according to a given formula; (ii) the filter design is only valid for a particular case and (iii) severe errors may occur if the actual spacing deviates from logarithmic spacing, which may be unavoidable due to physical dimensions of the drivers or due to design constraints. Further, the design is restricted to one type of drivers, i.e., full-range drivers, limiting the application to public address systems. Thus, a need still exists for a loudspeaker configuration and filter design that overcomes the limitations of the prior art by providing a loudspeaker system that can contain drivers of various physical dimensions and can achieve prescribed, constant directivity over a large area in both the vertical and horizontal planes.

SUMMARY

The invention is a multi-way loudspeaker speaker system that can produce high-quality sound from a single, compact, line array loudspeaker that can be utilized in a traditional surround sound entertainment system typically having left and right front and rear surround sound channels and a center channel.

In one embodiment, the line array includes a plurality of tweeters, mid-range drivers and woofers that are arranged in a single housing or assembled as a single unit, having sealed compartments that separate certain drivers from one another to prevent coupling of the drivers. The line array may be a single channel array having various signal paths from the input to individual loudspeaker drivers or to a plurality of drivers. Each signal path comprises digital input and contains a digital FIR filter and a power D/A converter connected to either a single driver or to multiple drivers.

The performance, positioning and arrangement of the loudspeaker drivers in the line array may be determined by a filter design algorithm that establishes the coefficients for each FIR filter in each signal flow path of the loudspeaker. A cost minimization function is applied to prescribed frequency points, using initial driver positions and initial directivity target functions, which establish frequency points on a logarithmic scale within the frequency range of interest. If the obtained results from the application of the cost minimization function do not meet the performance requirements of the system, the position of the drivers may then be modified and the cost minimization function may be reapplied until the obtained results meet the system requirements. Once the obtained results meet the system requirements, the linear phase filter coefficients for each FIR filter in a signal path are computed using the Fourier approximation method or other frequency sampling method.

The multi-way loudspeakers of the invention may include built-in DSP processing, D/A converters and amplifiers and may be connected to a digital network (e.g. IEEE 1394 standard). Further, the multi-way loudspeaker system of the invention, due to its compact dimensions, may be designed as a wall-mountable surround system.

The multi-way loudspeaker system may employ drivers of different sizes, producing low distortion, high-power handling because specialized drivers can operate optimally in their dedicated frequency band, as opposed to arrays of identical wide-band drivers. The multi-way speaker design of the invention can also provide better control of in-room responses due to smooth out-of-axis responses. The system is further able to control the frequency response of reflected sound, as well as the total sound power, thereby suppressing floor and ceiling reflections.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principles of the invention. Moreover, in the figures, like reference numerals designate corresponding parts throughout the different views.

DETAILED DESCRIPTION

Figure 1:
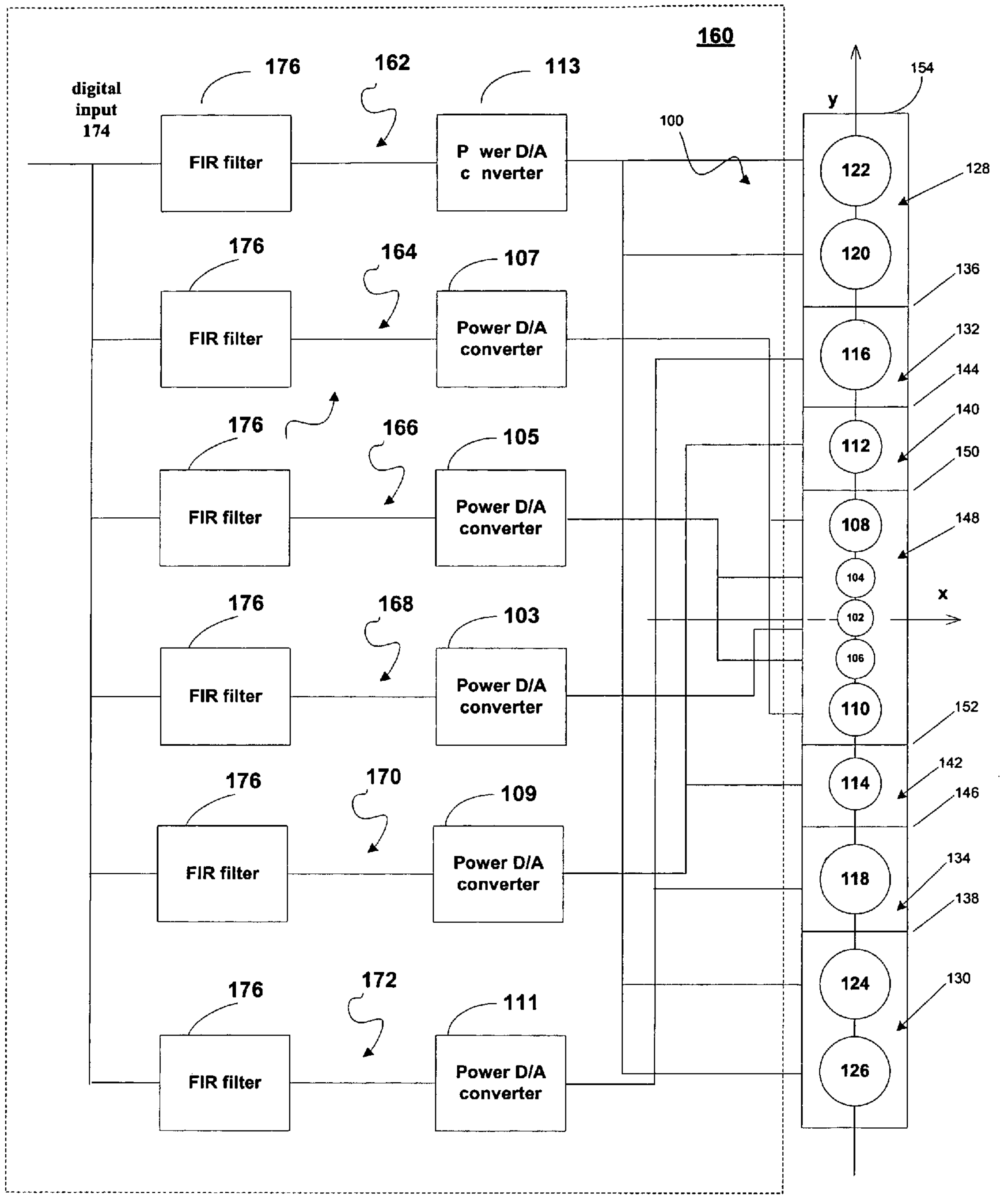
FIG. 1 illustrates an example of a one-dimensional six-way loudspeaker system mounted along the y-axis symmetrically to origin and a block diagram of signal flow to each of the loudspeaker drivers in the system.

FIG. 1 illustrates an example implementation of a one-dimensional (1D) multi-way loudspeaker 100 of the invention and a block diagram of the signal flow to each of the loudspeaker drivers in the system 100. As shown in FIG. 1, the multi-way loudspeaker 100 may be designed as a six-way loudspeaker having (i) a center tweeter 102 connected to a first power D/A converter 103, (ii) two additional tweeters 104 and 106 connected to a second power D/A converter 105, (iii) two midrange drivers 108 and 110 connected to a third power D/A converter 107, (iv) two midrange drivers 112 and 114 connected to fourth power D/A converter 109, (v) two woofers 116 and 118 connected to a fifth power D/A converter 111 and (vi) four woofers 120, 122, 124 and 126 connected to a sixth power D/A converter 113. The connection between the loudspeakers to each amplifier represents a different way in the multi-way loudspeaker. Thus, the loudspeaker may be designed as a single-channel multi-way loudspeaker.

In FIG. 1, the drivers, also referred to as transducers, may be mounted in a housing 154 comprised of separate sealed compartments 128, 130, 132, 134, 140, 142 and 148, as indicated by separators 136, 138, 144, 146, 150 and 152. By mounting the drivers in separate sealed compartments, coupling of the neighboring drivers is minimized. Although the various compartments are visible in FIG. 1, the loudspeaker system may be designed such that the compartments are not visible to the consumer when embodied in a finished product. Compartment 128, containing woofers 120, 122, may be separated by separator 136 from compartment 132, which contains woofer 116. Similarly, compartment 130, which contains woofers 126 and 124, may be separated by separator 138 from compartment 134, which contains woofer 118. The midrange drivers 112 and 114, contained in compartments 140 and 142, respectively, may be separated from compartments 132 and 134 by separators 144 and 146, respectively.

All of the tweeters 102, 104, 106, and midrange drivers 110 and 108 may also be contained in compartment 148 and separated from compartments 140 and 142 by separators 150 and 152, respectively.

FIG. 1 illustrates the center tweeter 102, tweeters 104 and 106, midrange drivers 110, 108, 112, 114, 116 and 118 and low-frequency woofers 120, 122, 124 and 126 mounted linearly along the y-axis and symmetrically about the center tweeter 102. A typical arrangement may include tweeters 102, 104 and 106 of outer diameters of approximately 40 mm, midrange drivers 110, 108, 112, 114, 116 and 118 of outer diameters of approximately 80 mm, and woofers 120, 122, 124 and 126 of outer diameters of approximately 120 mm. Typically, transducer cone size may differ based on the desired application and desired size of the array. Further, the transducers may utilize neodymium magnets, although it is not necessary for the described application to utilize that particular type of magnet.

The center tweeter 102 may be mounted on the y-axis at the center point 0 at the intersection between the x and y axis. The tweeters 104 and 106 may be mounted at their centers approximately +/−40 mm from the center point. The midrange drivers 110 and 108 may then be mounted at their centers approximately +/−110 mm from the center point 0. The midrange drivers 112 and 114 may then be mounted at their centers approximately +/−220 mm from the center point. The low-frequency woofers 116 and 118 may then be mounted at their centers approximately +/−350 mm from the center point. The low frequency woofers 120 and 124 may then be mounted at their centers approximately +/−520 mm from the center point. The low frequency woofers 122 and 126 may then be mounted at their centers approximately +/−860 mm from the center point.

FIG. 1 also illustrates a block diagram 160 of the signal flow of the multi-way loudspeaker system. While FIG. 1 illustrates six ways 162, 164, 166, 168, 170 and 172 of signal flow, a channel may be divided into two or more ways. The signal flow comprises a digital input 174 that may be implemented using standard interface formats, such as SPDIF or IEEE1394 and their derivatives, and that can be connected to the drivers through various paths or ways, such as those illustrated in FIG. 1. Each path or way 162, 164, 166, 168, 170 and 172 may contain a digital FIR filter 176 and a power D/A converter 103, 105, 107, 109, 111 and 113 connected to either a single or to multiple loudspeaker drivers. The power D/A converters 103, 105, 107, 109, 111 and 113 may be realized as cascades of conventional audio D/A converters (not shown) and power amplifiers (not shown), or as class-D power amplifiers (not shown) with direct digital inputs. The FIR filters 176 may be implemented with a digital signal processor (DSP) (not shown). The loudspeaker drivers may be tweeters, midrange drivers or woofers, such as those illustrated.

In operation, the outputs of each multiple FIR filter 176 are connected to multiple power D/A converters 103, 105, 107, 109, 111 and 113, that are then fed to multiple loudspeaker drivers 102, 104, 106, 108, 110, 112, 114, 116, 118, 120, 122, 124, and 126 that are mounted on a baffle of the housing 154. More than one driver such as 120, 122, 124, and 126 may be connected in parallel to a path or way 162 containing a power D/A converter 113.

Figure 2:
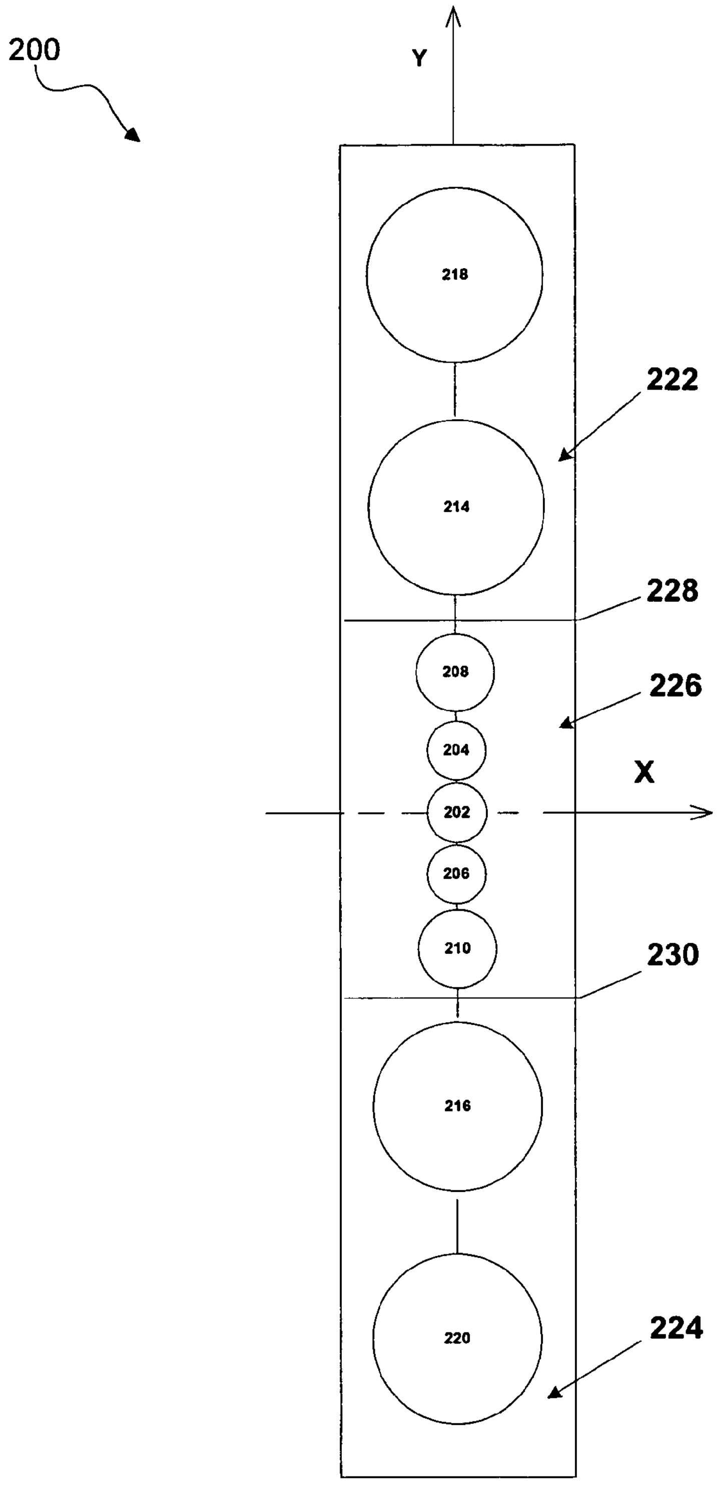
FIG. 2 illustrates another example implementation of a one-dimensional (1D) four-way loudspeaker system using nine loudspeaker drivers mounted along the y-axis symmetrically to origin.

FIG. 2 is another one-dimensional multi-way loudspeaker, similar to the loudspeaker of FIG. 1, except that it contains two rather than four mid-range drivers and four rather than six woofers. In particular, FIG. 2 illustrates a single channel, one-dimensional, four-way loudspeaker 200 having a center tweeter 202 encircled by two additional tweeters 204 and 206. Additionally, the loudspeaker 200 contains two midrange drivers 208 and 210 and four woofers 214, 216, 218 and 220. Tweeters 202, 204 and 206, the midrange drivers 208 and 210, and the four woofers 214, 216, 218 and 220 are all aligned linearly along the y-axis symmetrically about the center tweeter 202.

Three signal paths (not shown) may be fed into compartment 226. A first path may be fed to center tweeter 202; a second path may be fed to tweeters 204 and 206; and a third path may be fed to midrange drivers 208 and 210. Just above and below compartment 226, divided by separators represented by lines 228 and 230, respectively, are compartments 222 and 224 containing woofers 214 and 218 and woofers 216 and 220 respectively. Woofers 214, 218, 216 and 220 may all be fed by a fourth path.

A typical arrangement of the multi-way loudspeaker illustrated in FIG. 2 may include tweeters 202, 204 and 206 of outer diameters of approximately 40 mm, midrange drivers 208 and 210 of outer diameters of approximately 80 mm, and woofers 214, 216, 218 and 220 of outer diameters of approximately 160 mm. As previously mentioned, transducer cone size may differ based on the desired application and desired size of the array. The number of signal paths and number of any particular type of driver may also vary.

The center tweeter 202 may be mounted on the y-axis at the center point 0, which is illustrated in FIG. 2 at the intersection between the x and y axis. The tweeters 204 and 206 may then be mounted at their centers approximately +/−40 mm from the center point.

The midrange drivers 208 and 210 may then be mounted at their centers approximately +/−110 mm from the center point 0. The low frequency woofers 214 and 216 may then be mounted at their centers approximately +/−240 mm from the center point. The low frequency woofers 218 and 220 may then be mounted at their centers approximately +/−380 mm from the center point.

Figure 3:
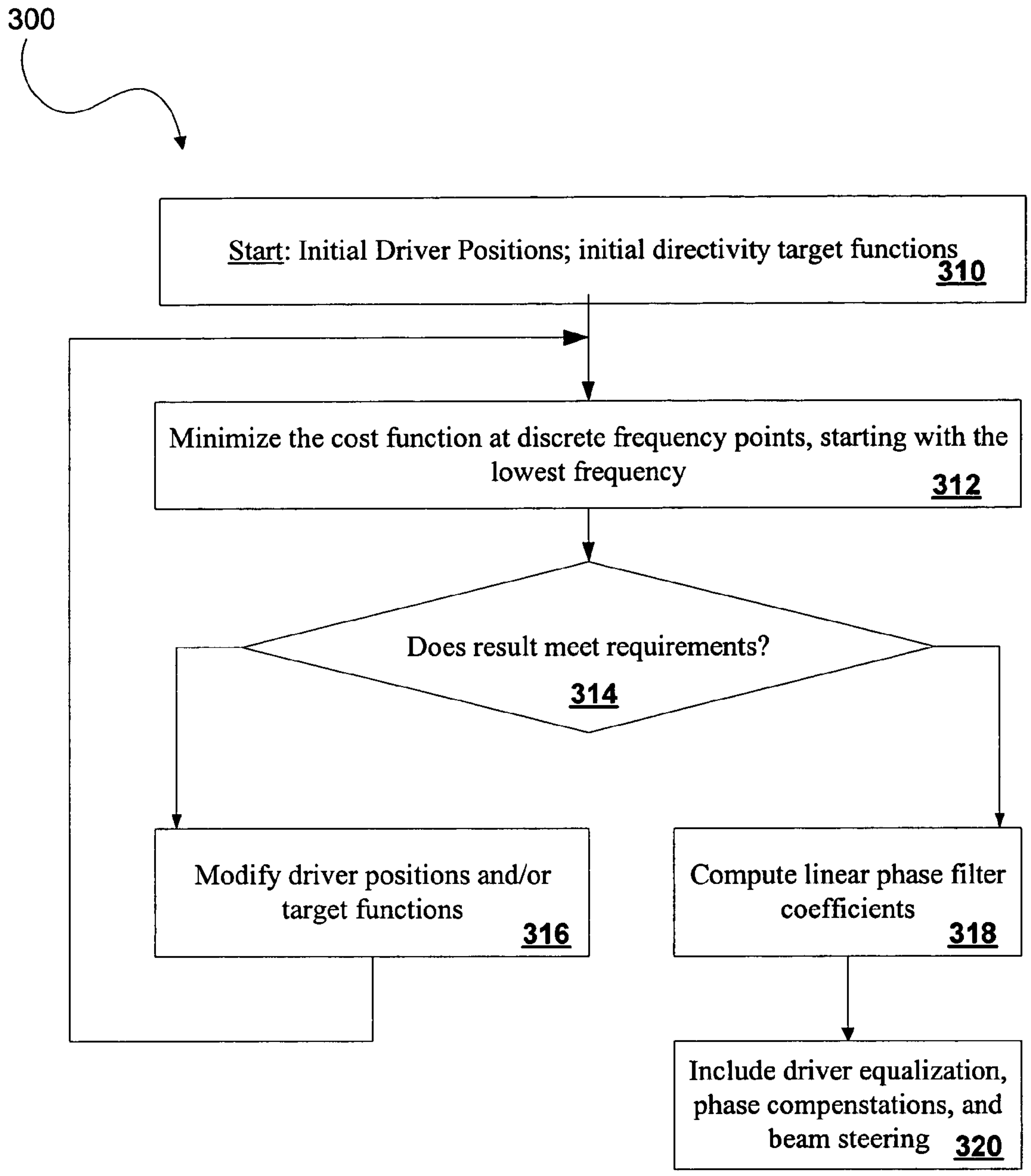
FIG. 3 is a flow chart of a filter design algorithm used to design the loudspeaker system.

FIG. 3 is a flow chart of a filter design algorithm 300 used to design the loudspeaker system of the invention. The purpose of the filter design algorithm 300 is to determine the coefficients for each FIR filter for each signal flow path of the loudspeaker. As illustrated in further detail below, the initial driver positions and initial directivity target functions are first determined 310. The initial positions or design configuration of the speaker and drivers may be designed in accordance with a number of different variables, depending upon the application, such as the desired size of the speaker, intended application or use, manufacturing constraints, aesthetics or other product design aspects. Driver coordinates are then prescribed for each driver along the main axis. Initial guesses for directivity target functions are then set, which includes establishing frequency points on a logarithmic scale within an interval of interest. The cost function is then minimized at the prescribed frequency points 312. If the results do not meet the performance requirements of the system, step 314, the position of the drivers are then modified and the cost minimization function is applied again 316. This cycle may be repeated until the results meet the requirements. Once the results meet the requirements, the linear phase filter coefficients are computed 318. Additionally computations 320 may also be made to equalize the drivers and to compensate for phase shifts and to modify beam steering.

In the first step 310, the initial driver positions and initial directivity target functions are established. As previously mentioned, the number, position, size and orientation of the drivers are primarily determined by product design aspects. Once orientated, initial coordinate values may then be prescribed for initial driver coordinates p(n), n=1 . . . N for N drivers on the main axis. For example, in a one-dimensional (1D) array as illustrated in FIG. 1, N=13: p(n)=[−0.86, −0.52, −0.35, −0.22, −0.11, −0.04, 0, 0.04, 0.11, 0.22, 0.35, 0.52, 0.86]m (meters).

Figure 4:
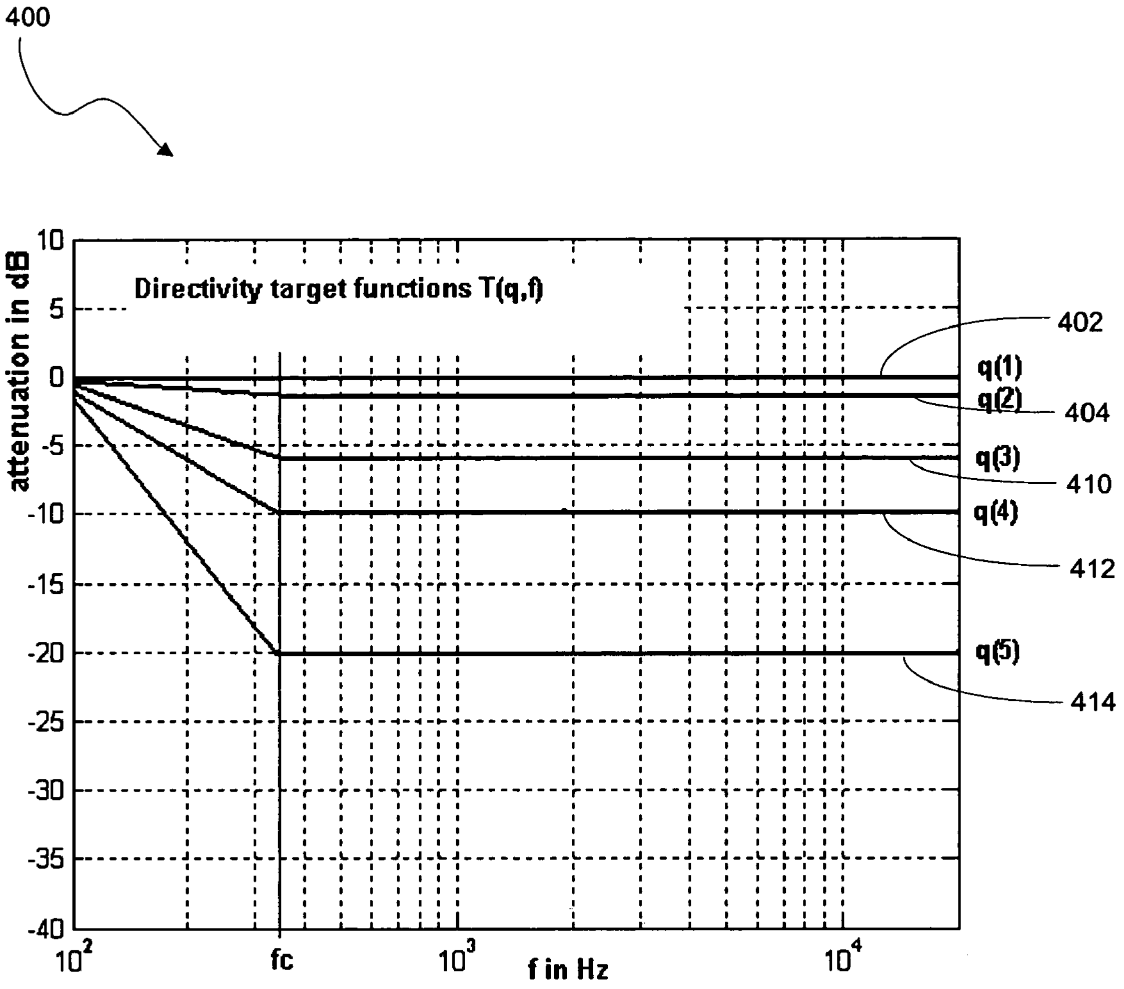
FIG. 4 is a graph illustrating the directivity target functions for angle-dependent attenuation.

To determine the initial directivity target functions, one must define initial guesses for directivity target functions T(f,q), which are determined based upon the desired performance of the drivers at specific angles q. FIG. 4 is a graph illustrating an example set of target functions for angle-dependent attenuation at five specific angles q. The directivity target functions specify the intended sound level attenuation in dB (y-axis) that can be measured at various frequencies at sufficiently large distance from the speaker (larger than the dimensions of the speaker) in an anechoic environment, at an angle q degrees apart from a line perpendicular to the origin (center tweeter). Frequency vector f specifies a set of frequency points, e.g. 100, on a logarithmic scale within the interval of interest, e.g. 100 Hz . . . 0.20 kHz.

Angle vector q(i), i=1, . . . , Nq specifies a set of angles for which the optimization will be performed. While FIG. 4, illustrates the initial guess for directivity at five set angles:

(Nq=5): q=[0,10,20,30,40]°, in most cases it may be sufficient to prescribe directivity at only two angles, i.e., Nq=2. In this instance, targeted directivity may be specified at an outer angle, for example 40 degrees, and at 0 degrees, the prescribed zero directivity on axis, i.e., q=[0,40]°.

Except for the on-axis target function, the target functions at each angle, are linearly descending on a double logarithmic scale from T=0 dB at f=0 until a value T<0 dB at a specified frequency fc (e.g. fc=350 Hz), then remain constant. The on-axis target function 402 remains constant at 0 db across the entire frequency range. The target directivity functions at ten (10) degrees 404, twenty (20) degrees 410, thirty (30) degrees 412 and forty (40) degrees 414, all begin at T=0 dB and descend on a double logarithmic scale until the functions reach fc, which is represented by 350 Hz in FIG. 4, and then remain constant across the remaining frequency range of interest.

Figure 5:
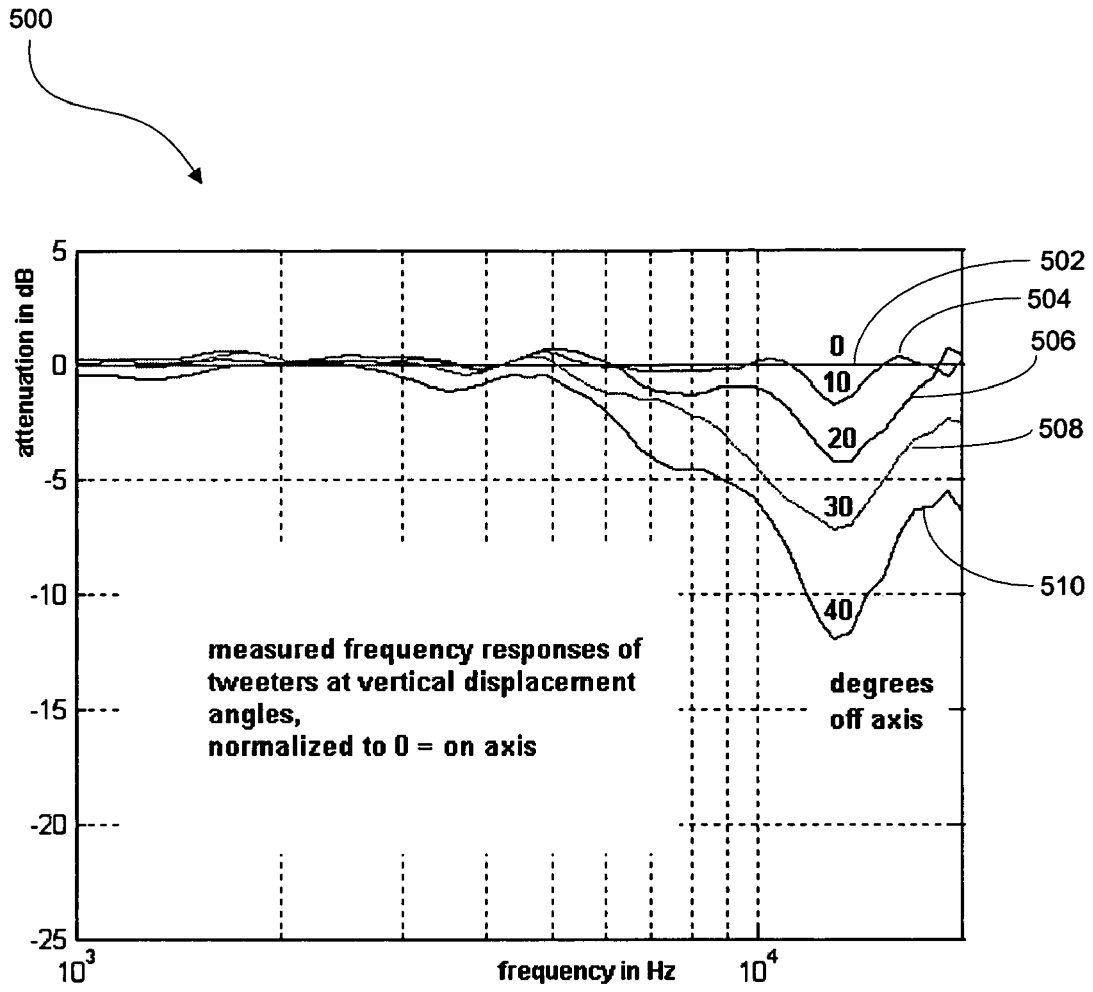
FIG. 5 is a graph illustrating the measurement of the amplitude frequency response of one mounted tweeter at various vertical out-of-axis displacement angles.

After the initial driver positions and initial directivity target functions are determined, the next step 312 is to minimize the cost function F(f) at the prescribed frequency vector points f, starting with the lowest frequency increment stepwise, e.g. 100 Hz, using the obtained solution as the initial solution for the next step, respectively, by using the following equations:

$$F(f) = \sum_{q(i)} [|V(f,q)| - T(f,q)]^2, \text{ with}$$

$$V(f,q) = \sum_{n=1}^{N} H_m(n,f,q) \cdot C_{opt}(n,f) \cdot \exp\left\{-j \cdot \frac{2\pi}{l(f)} \cdot \sin(q/180 \cdot \pi) \cdot p(n)\right\},$$

$$l = \frac{c}{f}, \quad c = 345 \text{ m/sec}, \quad j = \sqrt{-1}$$

where $H_m$(n,f,q) is a set of measured amplitude frequency responses for the considered driver n, frequency f, and angle q, normalized to the response obtained on axis (angle zero), an example of which is illustrated in FIG. 5. FIG. 5 illustrates the measured frequency responses 500 of one mounted tweeter at various vertical displacement angles normalized to on axis. In FIG. 5, line 502 represents the on-axis response, line 504 is the measured frequency response at ten degrees, line 506 is the response at twenty degrees, line 508 is the response at thirty degrees and line 510 is the measured frequency response at forty degrees, all measured at frequencies ranging between 1 kHz and 20 kHz.

Further, the minimization is performed by varying real-valued frequency points of the channel filters C opt(n,f), where n is the driver index and f is frequency, within the interval [0,1]. In addition, the constraint $$C_{opt}(n,f)=0, f>f_o, f<f_u$$

must be fulfilled, depending on properties of particular driver n. For example, in case of a woofer, the upper operating limit is fo=1 kHz, for a tweeter, the lower limit is fu=2 kHz, for a midrange driver it could be fu=300 Hz, fo=3 kHz.

The above described procedure for minimizing the cost function may be performed by a function "fminsearch," that is part of the Matlab® software package, owned and distributed by The MathWorks, Inc. The "fminsearch" function in the Matlab software packages uses the Nelder-Mead simplex algorithm or their derivatives. Alternatively, an exhaustive search over a predefined grid on the constrained parameter range may be applied. Other methodologies may also be used to minimize the cost function.

Figure 6:
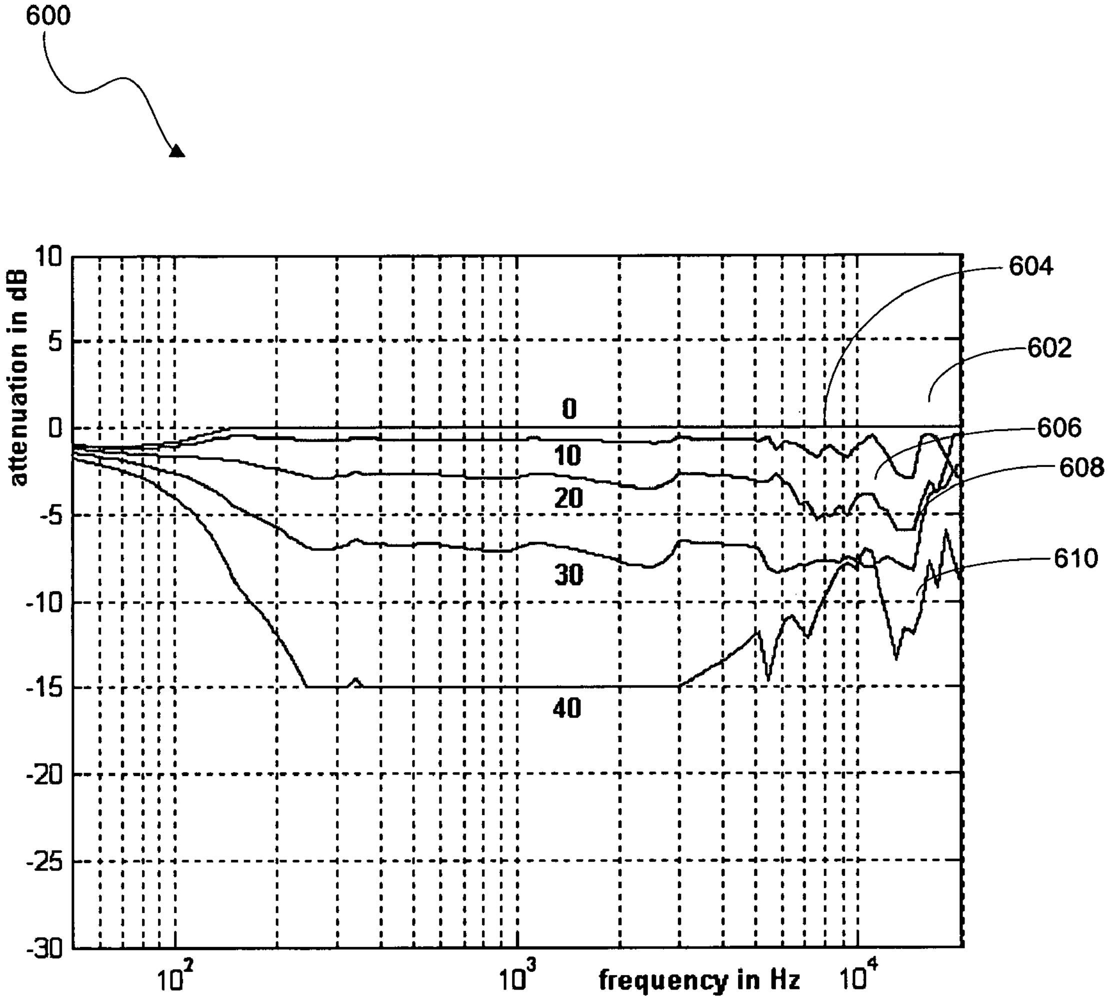
FIG. 6 is a graph illustrating acceptable obtained results for a line array similar to the one illustrated in FIG. 1, determined along the y-axis.

If the deviation between the obtained result and the target is sufficiently small, or acceptable as determined by one skilled in the art for the particular design application, the FIR filter coefficients for each signal path in the line array are then obtained. FIG. 6 is a graph 600 of acceptable obtained results for a line array similar to the one illustrated in FIG. 1, determined along the y-axis. The graph shows the obtained filter frequency responses V(f,q) after passing step 314 in FIG. 3. Passing means that the result met the requirements. In FIG. 6, line 602 represents the on-axis response V(f,q(1)), line 604 the frequency response at ten degrees V(f,q(2)), line 606 is the response at twenty degrees V(f,q(3)), line 608 is the response at thirty degrees V(f,q(4)) and line 610 is the measured frequency response at forty degrees V(f,q(5)), all shown at frequencies ranging between 50 Hz and 20 kHz.

Figure 7:
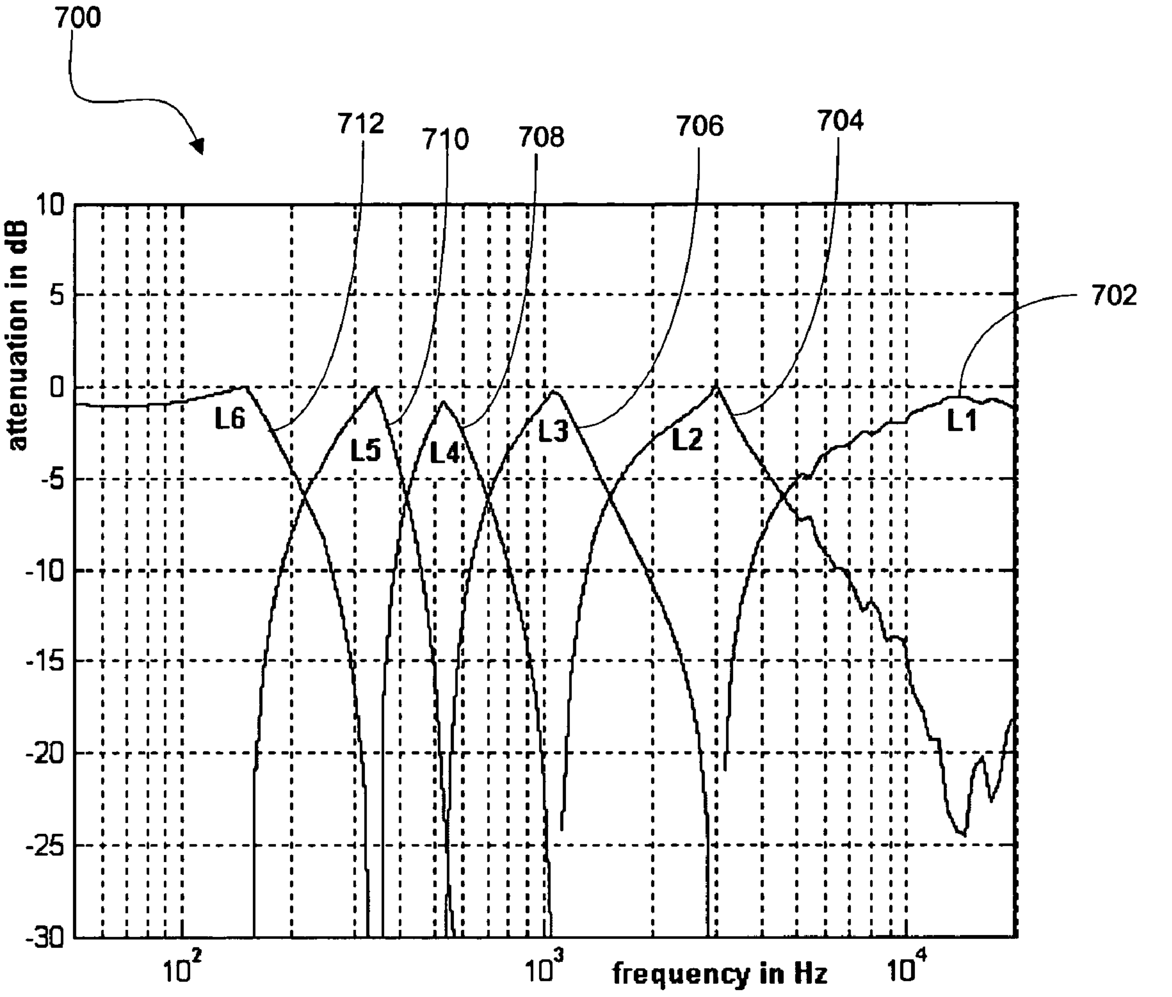
FIG. 7 is a graph illustrating the frequency response of the digital filters assigned to signal paths of the line array design illustrated in FIG. 1 after a cost minimization function has been applied.

FIG. 7 is graph 700 illustrating the resulting frequency responses Copt(n,f) of each of the six signal paths in the line array loudspeakers system illustrated in FIG. 1 once the cost minimization function has been applied and the obtained results have been found to be sufficiently small or within the acceptable range for the desired application. The line represented by L1 or 702 is the frequency response of the first signal path which feeds the center channel tweeter 102 (FIG. 1); L2 or 704 is the frequency response of the second signal path which feeds the tweeters 104 and 106 (FIG. 1); L3 or 706 is the frequency response of the third signal path which feeds the mid-range drivers 110 and 108 (FIG. 1); L4 or 708 is the frequency response of the fourth signal path which feeds mid-range drivers 114 and 116 (FIG. 1); L5 or 710 is the frequency response of the fifth signal path which feeds woofers 116 and 118 and L6 or 812 is the frequency response of the sixth signal path which feeds woofers 120, 122, 124 and 126.

If the deviation between the obtained results and the target are not acceptable for the particular design application, i.e. or are too large, the driver positions or geometry, and/or parameters q(i) and fc of the target function T(f,g) (see FIG. 3) should then be modified. Once modified, the cost minimization function should again be applied and the process should be repeated until obtained results and the target are sufficiently small or with an acceptable range for the application.

Once the driver positions and driver geometry are positioned such that the algorithm as shown in FIG. 3 yields results within an acceptable range of the target function, the FIR filter coefficients for each signal path n=1 . . . N must then be determined, depicted as step 318 in FIG. 3. One method for determining the FIR coefficients is to use a Fourier approximation (frequency sampling method), to obtain linear phase filters of given degree. When applying the Fourier approximation, or other frequency sampling method, a degree should be chosen such that the approximation becomes sufficiently accurate.

The Fourier approximation method may be performed by a function "firls," that is part of the Matlab® software package, owned and distributed by The MathWorks, Inc. Similar methodologies may be used to minimize the cost function by implementing in other software systems.

Figure 8:
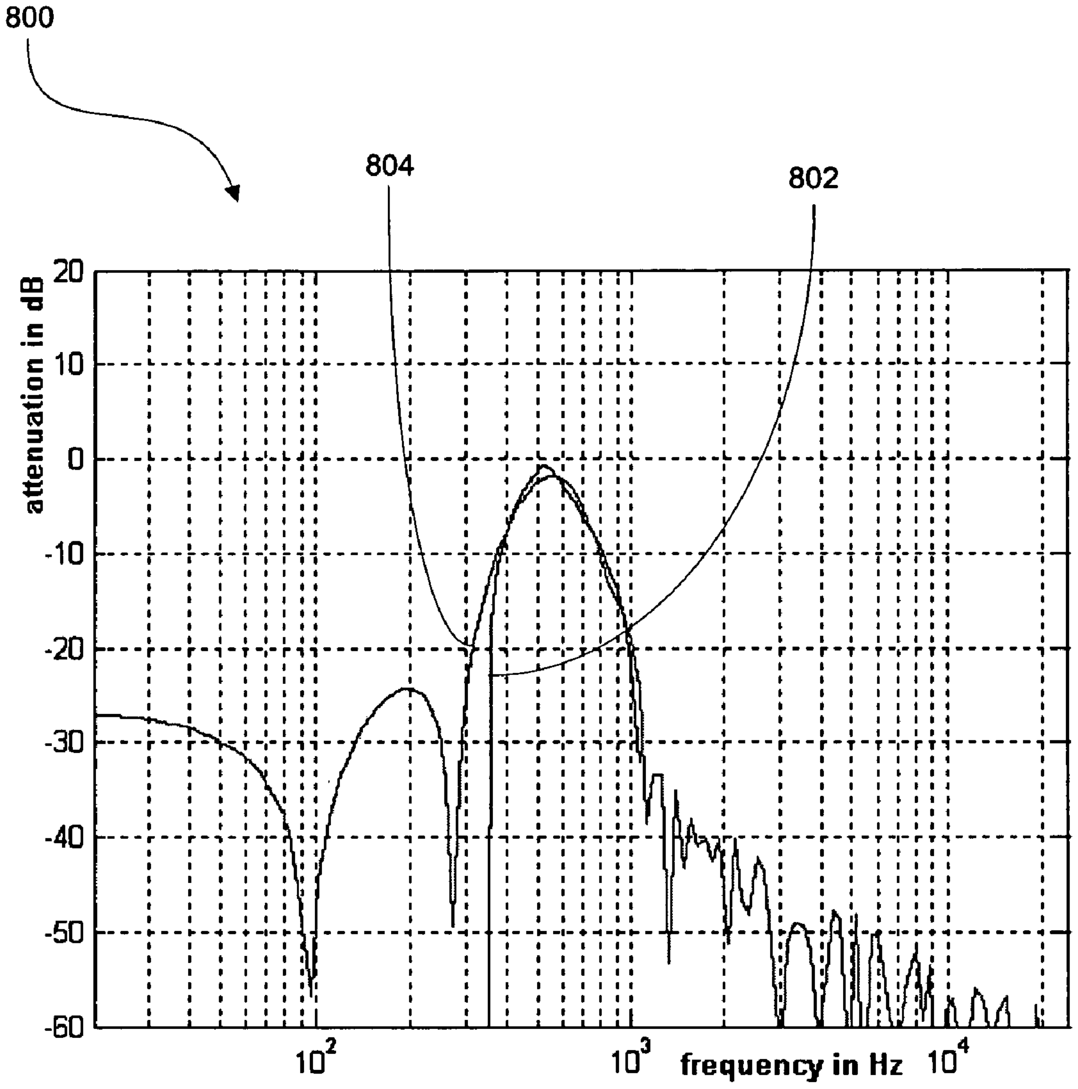
FIG. 8 is a graph illustrating a smoothed frequency response of the third signal path illustrated in FIG. 7 together with the frequency response of the linear FIR filter after the FIR filter coefficient has been established and applied.

FIG. 8 is a graph 800 illustrating a frequency response of one signal path 802 which is identical to L4 or 708 of FIG. 7, together with the frequency response of the linear phase FIR filter 804 after the FIR filter coefficients have been obtained in accordance with the method described above.

Additionally, modifications can be made to the FIR filters to equalize the measured frequency response of one or more drivers (in particular tweeters, midranges). The impulse response of such a filter can be obtained by well-known methods, and must be convolved with the impulse response of the linear phase channel filter when determining the FIR filter coefficients, as described above. Further, the voice coils (acoustic centers of the drivers) may not be aligned. To compensate for this, appropriate delays can be incorporated into the filters by adding leading zeros to the FIR impulse response.

Further, delays may be added to each channel in accordance with the following equation:

$$\Delta t=p/c\cdot\sin\alpha, \ (p=\text{driver coordinates}, \ c=345 \text{ m/sec})$$

where the main sound beam, which is otherwise perpendicular to the main axis, can be steered to a desired direction with angle α.

Further, the geometry of the one-dimensional layout may be modified such that the design process can be carried out in two dimensions, i.e., along both the x and y-axis, as described above by making the geometry symmetrical. Due to the symmetry, the same directivity characteristics will result along the y-axis (vertical), except of a higher corner frequency.

While various embodiments of the invention have been described, it will be apparent to those of ordinary skill in the art that many more embodiments and implementations are possible within the scope of this invention. Accordingly, the invention is not to be restricted except in light of the attached claims and their equivalents.

What is claimed is:

1. A loudspeaker, comprising:

one center driver mounted at approximately an intersection of an x-axis and a y-axis of the loudspeaker;

at least two drivers of a size different than the center driver mounted symmetrically along the loudspeaker in both the x-axis and y-axis about the center driver;

the center driver and the at least two drivers mounted symmetrically about the center driver each receiving a digital input signal filtered through at least one digital FIR filter and converted to analog by at least one power D/A converter;

and the at least two drivers each positioned at a distance relative to the intersection that is determined by adjusting an initial distance position of the drivers based upon application of a cost minimization function, where the cost function is minimized at frequency points within a frequency range based upon initial directivity target functions that define performance requirements at the frequency points and where the cost minimization function defines amplitude frequency responses normalized to a line perpendicular to a plane formed by the x-axis and the y-axis.

2. The loudspeaker of claim 1, where the center driver is a tweeter.

3. The loudspeaker of claim 2, where the at least two drivers are tweeters and the loudspeaker further includes at least two additional transducers, where the center driver and the at least two drivers are positioned between the two additional transducers symmetrically about the center driver.

4. The loudspeaker of claim 3, where the at least two additional transducers are mid-range speakers.

5. The loudspeaker of claim 3, where the at least two additional transducers are woofers.

6. The loudspeaker of claim 1, where the at least two drivers are woofers.

7. The loudspeaker of claim 1, where the at least two drivers are mid-range drivers.

8. The loudspeaker of claim 1, further comprising at least two additional drivers positioned at a point further away from the center driver than the at least two drivers.

9. The loudspeaker of claim 8, where the at least two additional drivers are woofers.

10. The loudspeaker of claim 1, where the initial directivity target functions define performance requirements for sound level attenuations for the center driver and the at least two drivers, each of the performance requirements being defined at a corresponding one of the frequency points and along a corresponding one of a plurality of lines with respective angles relative to the line perpendicular to the plane formed by the x-axis and the y-axis.

11. A loudspeaker, comprising:

a center tweeter positioned at a point of intersection between an x-axis and a y-axis, referred to as a point of origin;

at least two midrange drivers positioned symmetrically about the point of origin, where the at least two midrange drivers are larger in size than the center tweeter; and at least two woofers of larger size than the at least two midrange drivers, the at least two woofer positioned further away from the center tweeters than the at least two midrange drivers and symmetrically arranged about the point of origin;

where the center tweeter, the at least two midrange drives and the at least two woofers each receive a digital input signal filtered through at least one digital FIR filter and converted to analog by at least one power D/A converter; and the at least two midrange drivers, and the at least two woofers positioned at a distance relative to the point of intersection that is determined based upon application of a cost minimization function to an initial distance positions of the drivers, where the cost function is minimized at frequency points within a frequency range based upon initial directivity target functions that define performance requirements at the frequency points and where the cost minimization function defines amplitude frequency responses normalized to a line perpendicular to a plane formed by the x-axis and the y-axis.

12. The loudspeaker of claim 11, further including at least two additional tweeters, symmetrically arranged about the center tweeter and positioned between the center tweeter and the at least two midrange drivers.

13. The loudspeaker of claim 11, further including at least two additional woofers positioned near the opposing ends of the loudspeaker such that the center tweeter, the at least two mid-range drivers and the at least two woofers are positioned between the at least two additional woofers.

14. The loudspeaker of claim 11, where the initial directivity target functions define performance requirements for sound level attenuations for the center driver and the at least two drivers, each of the performance requirements being defined at a corresponding one of the frequency points and along a corresponding one of a plurality of lines with respective angles relative to the line perpendicular to the plane formed by the x-axis and the y-axis.

15. A loudspeaker comprising:

at least one center tweeter positioned at an intersection of an x-axis and a y-axis;

at least two additional tweeters, one of the at least two additional tweeters positioned on each side of the center tweeter;

at least two midrange drivers, one of the at least two midrange drivers positioned on each side of the at least two additional tweeters; and at least two woofers, one of the at least two woofers positioned on each side of the at least two midrange drivers;

where the at least one center tweeter, the at least two additional tweeters, the at least two midrange drivers and the at least two woofers each receive a digital input signal filtered through at least one digital FIR filter and converted to analog by at least one power D/A converter; and the at least two additional tweeters, the at least two midrange drivers, and the at least two woofers positioned at a distance relative to the intersection based upon application of a cost minimization function to an initial position of the drivers, where the cost function is minimized at frequency points within a frequency range based upon initial directivity target functions that define performance requirements at the frequency points and where the cost minimization function defines amplitude frequency responses normalized to a line perpendicular to a plane formed by the x-axis and the y-axis.

16. The loudspeaker of claim 15, where the initial directivity target functions define performance requirements for sound level attenuations for the center driver and the at least two drivers, each of the performance requirements being defined at a corresponding one of the frequency points and along a corresponding one of a plurality of lines with respective angles relative to the line perpendicular to the plane formed by the x-axis and the y-axis.

* * * * *

UNITED STATES PATENT AND TRADEMARK OFFICE

CERTIFICATE OF CORRECTION

PATENT NO. : 8,170,233 B2
APPLICATION NO. : 10/771190
DATED : May 1, 2012
INVENTOR(S) : Horbach It is certified that error appears in the above-identified patent and that said Letters Patent is hereby corrected as shown below:

In FIG. 1, the housing of the loudspeaker 100 should be labeled with reference numeral 154.

At column 5, lines 15–16, "...the multi-way loudspeaker illustrated..." should be changed to -- them multi-way loudspeaker 200 illustrated --.

At column 6, lines 7–8, "...is a graph illustrating..." should be changed to -- is a graph 400 illustrating --.

At column 6, line 18, "...0.20 kHz..." should be changed to -- 20 kHz --.

At column 6, line 34, "...0 db..." should be changed to -- 0 dB --.

At column 7, line 57, "...target function T(f,g)..." should be changed to -- target function T(f,q) --.

At column 9, line 40, claim 11, "...at least two woofer..." should be changed to -- at least two woofers --.

At column 9, line 44, claim 11, "...at least two midrange drives" should be changed to -- at least two midrange drivers --.

Signed and Sealed this
Twenty-ninth Day of January, 2013

David J. Kappos
*Director of the United States Patent and Trademark Office*